(12) United States Patent
Ho et al.

(10) Patent No.: US 6,319,808 B1
(45) Date of Patent: Nov. 20, 2001

(54) OHMIC CONTACT TO SEMICONDUCTOR DEVICES AND METHOD OF MANUFACTURING THE SAME

(75) Inventors: Jin-Kuo Ho, Taipei; Charng-Shyang Jong, Hsinchu; Chao-Nien Huang, Hsinchu; Chin-Yuan Chen, Hsinchu; Chienchia Chiu, Taipei; Chenn-shiung Cheng; Kwang Kuo Shih, both of Hsinchu, all of (TW)

(73) Assignee: Industrial TechnologyResearch Institute, Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/325,240

(22) Filed: Jun. 3, 1999

(30) Foreign Application Priority Data

Oct. 26, 1998 (TW) ............................................. 87117694 A

(51) Int. Cl.[7] ................................................. H01L 21/44
(52) U.S. Cl. ...................... 438/597; 438/606; 438/608; 438/685; 438/686
(58) Field of Search ............................... 438/104, 597, 438/606, 608, 685, 686, 785; 148/DIG. 20

(56) References Cited

U.S. PATENT DOCUMENTS

| | | | |
|---|---|---|---|
| 5,415,389 | * | 5/1995 | Watanabe ............................... 257/295 |
| 5,501,744 | * | 3/1996 | Albright et al. ......................... 257/51 |
| 5,504,041 | * | 4/1996 | Summerfelt et al. ................... 438/396 |
| 5,550,081 | * | 8/1996 | Holonyak, Jr. et al. ............... 438/606 |
| 5,554,564 | * | 9/1996 | Nishioka et al. ...................... 438/396 |
| 5,561,082 | * | 10/1996 | Matsuo et al. ......................... 438/396 |
| 5,565,422 | * | 10/1996 | Nakamura et al. ..................... 257/13 |
| 5,619,393 | * | 4/1997 | Summerfelt et al. ................. 438/608 |
| 5,756,207 | * | 5/1998 | Clough et al. ......................... 428/375 |

OTHER PUBLICATIONS

Baca et al. "A survey of ohmic contacts to III–V compound semiconductors", 1997, Thin Solid Films, 5599–606.*
Buchinsky, O. et al., 1999 Digest of the LEOS Summer Topical Meetings, Jul. 1999, San Diego, CA, pp. 11179–11180.
Ho, Jin–Kuo et al., *Applied Physics Letters* 74:9 (Mar. 1, 1999).
Ho, Jin–Kuo et al., *Journal of Applied Physics* 86:8 (Oct. 15, 1999).

* cited by examiner

*Primary Examiner*—Carl Whitehead, Jr.
*Assistant Examiner*—Maria Guerrero
(74) *Attorney, Agent, or Firm*—Townsend and Townsend and Crew LLP

(57) ABSTRACT

An ohmic contact of semiconductor and its manufacturing method are disclosed. The present invention provides a low resistivity ohmic contact so as to improve the performance and reliability of the semiconductor device. This ohmic contact is formed by first coating a transition metal and a noble metal on a semiconductor material; then heat-treating the transition metal and the noble metal in an oxidizing environment to oxidize the transition metal. In other words, this ohmic contact primarily includes a transition metal oxide and a noble metal. The oxide in the film can be a single oxide, or a mixture of various oxides, or a solid solution of various oxides. The metal of the film can be a single metal, or various metals or an alloy thereof. The structure of the film can be a mixture or a laminate or multilayered including oxide and metal. The layer structure includes at least one oxide layer and one metal layer, in which at least one oxide layer is contacting to semiconductor.

7 Claims, 3 Drawing Sheets

OHMIC CONTACT TO SEMICONDUCTOR DEVICES AND METHOD OF MANUFACTURING THE SAME

BACKGROUND OF THE INVENTION

1. Field of the Invention

This invention relates to an ohmic contact to semiconductor devices and its manufacturing method, particularly an ohmic contact to p-type gallium nitride and the method of manufacturing the same.

2. Description of Prior Art

In recent years, gallium nitride (hereinafter referred to as GaN) has been broadly used in the fabrication of short-wavelength light-emitting diodes, laser diodes, photo-detectors and microelectronic components, etc. Good ohmic contact is especially important to commercialized light-emitting devices. Currently, the specific contact resistance for n-type GaN has been reduced to about $10^{-4}$~$10^{-8}$ $\Omega \cdot cm^2$. As for p-type GaN, however, the specific contact resistance can only attain $10^{-2}$~$10^{-3}$ $\Omega \cdot cm^2$, much higher than that for the contact to n-type GaN. Such a high interface resistance markedly affects the performance and reliability of these devices. Therefore, it is an important issue for the scientists and engineers to lower the specific contact resistance of the contact to p-type GaN. Until now, most conventional methods to manufacture contacts to p-type GaN deposit the metals directly. For example, in U.S. Pat. No. 5,652,434, the Nichia Chemical Industrial Company uses Ni or Ni/Au in its light-emitting diodes (LED) to form a contact. In addition, in U.S. Pat. No. 5,739,554, Cree Research Company uses Ti/Au, Ti/Ni or Ni/Au in its LED to form contact. But neither described the specific contact resistance of the contacts. In other references, other kinds of metals are disclosed, such as Au, Ni, Ti, Pd, Pt, W, WSix, Ni/Au, Pt/Au, Cr/Au, Pd/Au, Au/Mg/Au, Pd/Pt/Au, Ni/Cr/Au, Ni/Pt/Au, Pt/Ni/Au, Ni/Au-Zn, Ni/Mg/Ni/Si, etc. However, the specific contact resistance of the above metal contacts can only attain $10^{-2}$~$10^{-3}$ cm.$^{-2}$, which is higher than $10^{-4}$ cm$^{-2}$ generally required for optoelectronic devices. In addition, almost all of the above metals do not exhibit ohmic behavior.

SUMMARY OF THE INVENTION

Accordingly, the object of this invention is to provide an ohmic contact to semiconductor devices and its manufacturing method by which the interface resistance of ohmic contact is lowered so as to improve the performance and reliability of semiconductor devices.

This invention provides a new semiconductor manufacturing process which can form an ohmic contact to p-type GaN with a low interface resistance for application in the fabrication of GaN-based devices.

The manufacturing method of this invention forms a film, which includes transition metal and noble metal, on the semiconductor substrate. Then, the film is heat-treated and oxidized to obtain an ohmic contact with a low specific contact resistance. So formed, an ohmic contact can meet the requirement of an optoelectronic device; that is, the specific contact resistance of the ohmic contact is lower than $10^{-4}$ cm.$^{-2}$.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

The method of fabricating an ohmic contact to semiconductors according to this invention includes the steps of: coating a transition metal and a noble metal or an alloy thereof on a semiconductor material, then heat-treating the metal layer in an oxidizing ambience so that the transition metal is oxidized to form an oxide.

The semiconductor described above is p-type GaN. The transition metal can be Ni, Mn, Cr, Cu, Fe, Co or Pd, etc. The noble metal can be Au, Pt, Rh, Ru, or Ir, etc.

The oxide mentioned above is a single oxide, or a mixture of various oxides such as NiO/CoO or a solid solution of various oxides such as $Ni_xCo_{1-x}O$ ($0<x<1$) etc. The metal in the above film can be a single metal, or various metals or an alloy thereof.

Another layer of metal can be further formed thereon. Such layer of metal can a single metal such as Au or Ni, a plurality of layers of metals, or a layer of alloy such as Cr/Au or Ti/Pt/Au, etc., for connecting with other circuits.

Figure 1:
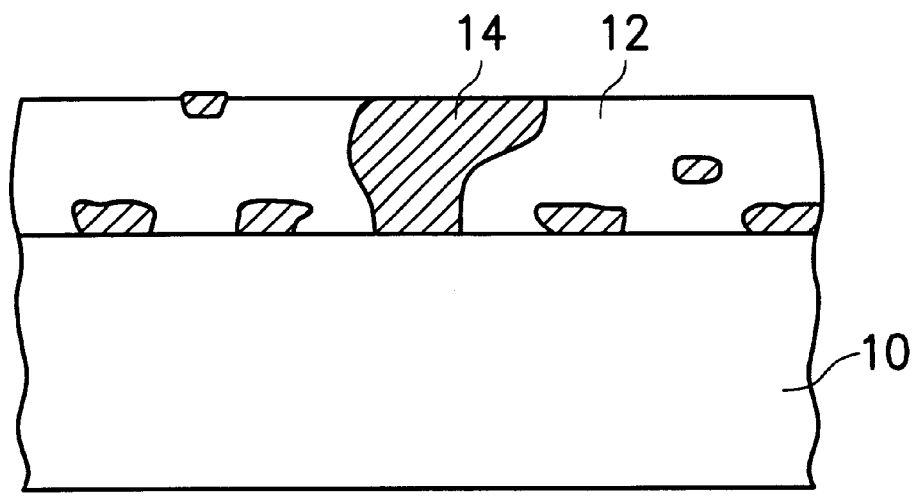
FIG. 1 is a diagram illustrating the structure of an ohmic contact according to one embodiment of the invention.

The ohmic contact formed by the above method has different structures according to different preparation methods of the transition metal and the noble metal. In the first embodiment, after heat-treatment, the transition metal and the noble metal formed on the semiconductor material 10 becomes a mixture of semiconductor oxide 12 and metal 14 as shown in FIG. 1.

In the first embodiment, the above semiconductor material 10 is formed on a sapphire substrate, with an undoped GaN layer and a GaN layer doped with Mg, each 2 $\mu$m thick, formed by MOCVD method. Using this semiconductor material as a test sheet, it is heat-treated in a nitrogen atmosphere to make the Mg doped GaN layer become p-type. This test sheet has an electron concentration of $1\times10^{17}$ cm$^{-3}$ for its undoped GaN layer and a hole concentration of $2\times10^{17}$ cm$^{-3}$ for its p-type GaN. A CTLM (circular transmission line model) method is used in the invention to calculate the specific contact resistance ($\rho_c$)

Figure 3A:
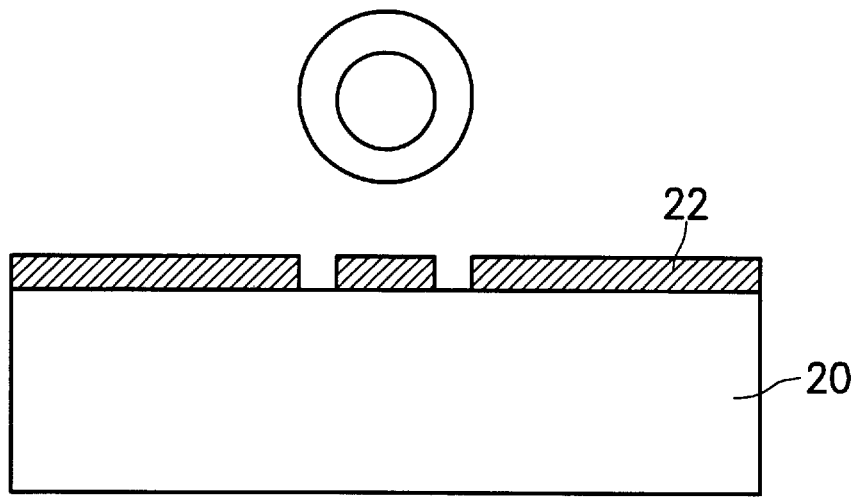
FIG. 3a is diagram illustrating a pattern formed on a substrate in the CTLM measurement used in this invention.

Next, the fabrication and measurement procedure for the ohmic contact of this invention is described, which includes the steps of: (i) forming a photoresist layer on the GaN 20 with a CTLM pattern; (ii) removing the GaN surface oxide by dipping the test sheet in a solution of HCl: $H_2O=1:1$ for 3 minutes, then blowing dry the GaN and putting the test sheet immediately into a vacuum chamber of an electron-gun coating system; (iii) degassing the chamber of the electron-gun coating system to a high vacuum, then proceeding with the coating of various metals; (iv) lifting-off a part of metal film to form a metal pattern 22 as shown in FIG. 3(a); (v) heat-treating the test sheet in air, oxygen, 10% $H_2$–90% $N_2$ or nitrogen atmosphere, in which the temperature is from 200° C. to 900° C., and the time is 10 minutes; (vi) conducting I–V measurement for the test sheet; and (vii) analyzing the $\rho_c$ values.

Next, the CTLM measurement and analysis used in the above steps is described, in which the measurement of I–V characteristic to respectively is used to figure out the resistance between the metals within the inner ring and outside the outer ring of two concentric circles. The analysis of $\rho_c$ is conducted on the I–V curves of ±0.5 V and ±20 mA. Generally speaking, the contact structures of this invention exhibits ohmic behavior within the above testing range, i.e., it is provided with a linear I–V curve. Therefore, the specific contact resistance can be calculated through the slope of the curve. The formula of calculating $\rho_c$ for the CTLM method is as follows:

$$R_t=(R_{sh}/2\pi)[ln(R/r)+L_t(r^{-1}+R^{-1})]$$

$$\rho_c=R_{sh}\times L_t^2$$

where $R_t$ serves as the total resistance of the I–V measurement, $R_{sh}$ is the sheet resistance, and r and R respectively represent the radius of the inner and outer concentric circles, $L_t$ is the transfer length. According to the above formula, a diagram can be formed through $R_t$ of the I–V measurement to the $ln(R/r)$. Then a linear curve can be obtained by processing the diagram with the least square linear curve fitting method. The slope of the obtained curve is $R_{sh}/2\pi$. The intercept can thus be calculated by the formula when R equals to r, to be $R_{sh}L_t/r\pi$, so that $R_{sh}$ and $L_t$ can be figured out to further calculate $\rho_c$.

Figure 3B:
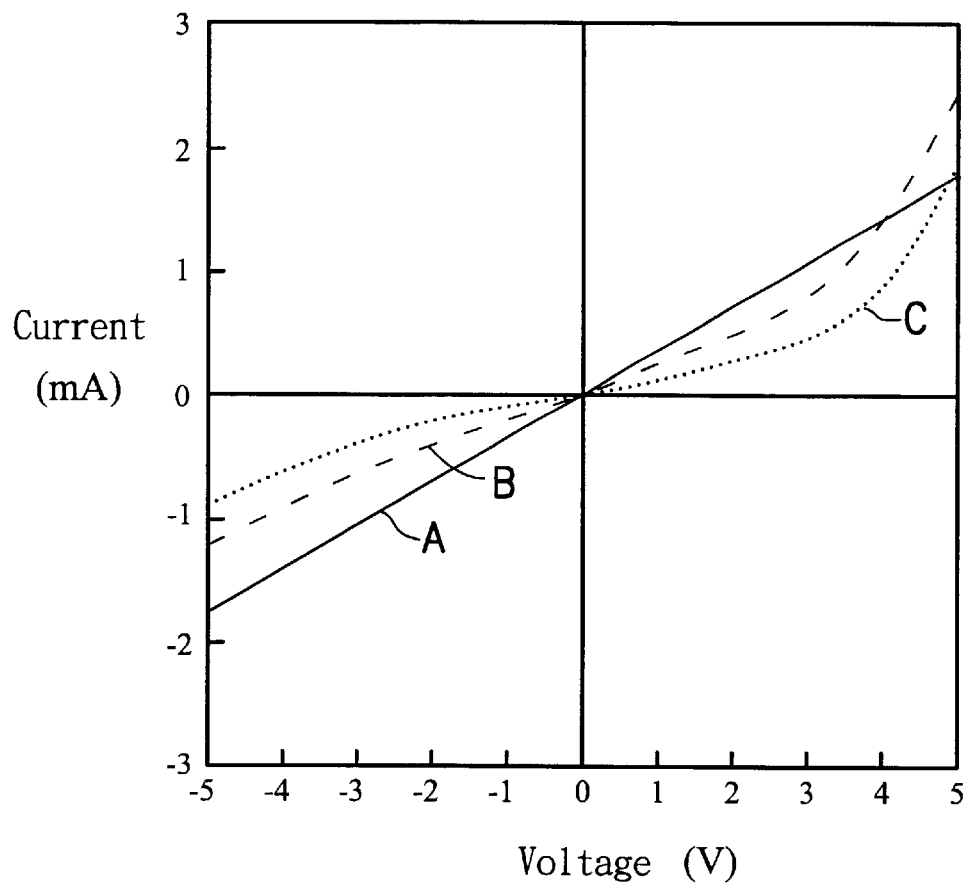
FIG. 3b illustrates the current-voltage (I–V) measurement of Ni-Au contacts formed on p-type GaN and heat-treated in various ambiences.

FIG. 3b illustrates the measurement results of this invention, which shows the I–V characteristic of Ni/Au contacts formed on p-type GaN and heat-treated in various atmospheres, wherein curve A represents the situation in which Ni/Au is heat-treated in air or oxygen atmosphere, curve B, in nitrogen atmosphere, and curve C, in 10% $H_2$–90% $N_2$ atmosphere. The temperature of the heat treatment process is 500 °C. and the heat-treating time is 10 minutes. The slope of the curve is a maximum, that is, the $\rho_c$ value is a minimum, and the positive current and the negative current is symmetrical to the original point after oxidizing the Ni/Au film. On the other hand, the Ni/Au layer is still a metal film after the test sheet is heat-treated in nitrogen or 10% $H_2$–90% $N_2$. This results in an increase in the obtained $\rho_c$. The I–V curve does not maintain linearity when the metal contact is biased at a higher voltage, and the positive and negative currents are not symmetrical to each other. Please also refer to the following Table 1, in which the Ni/Au thin film heat-treated in air of this embodiment still displays a good conductivity.

TABLE 1

| Condition | Sheet resistance (Ω/□) | Resistivity ($\mu\Omega \cdot cm$) |
| --- | --- | --- |
| As-deposited | 11.87 | 17.8 |
| $N_2$, 500° C., 10 min | 16.82 | 25.2 |
| Air, 500° C., 10 min | 38.94 | 97.4 |

Figure 4:
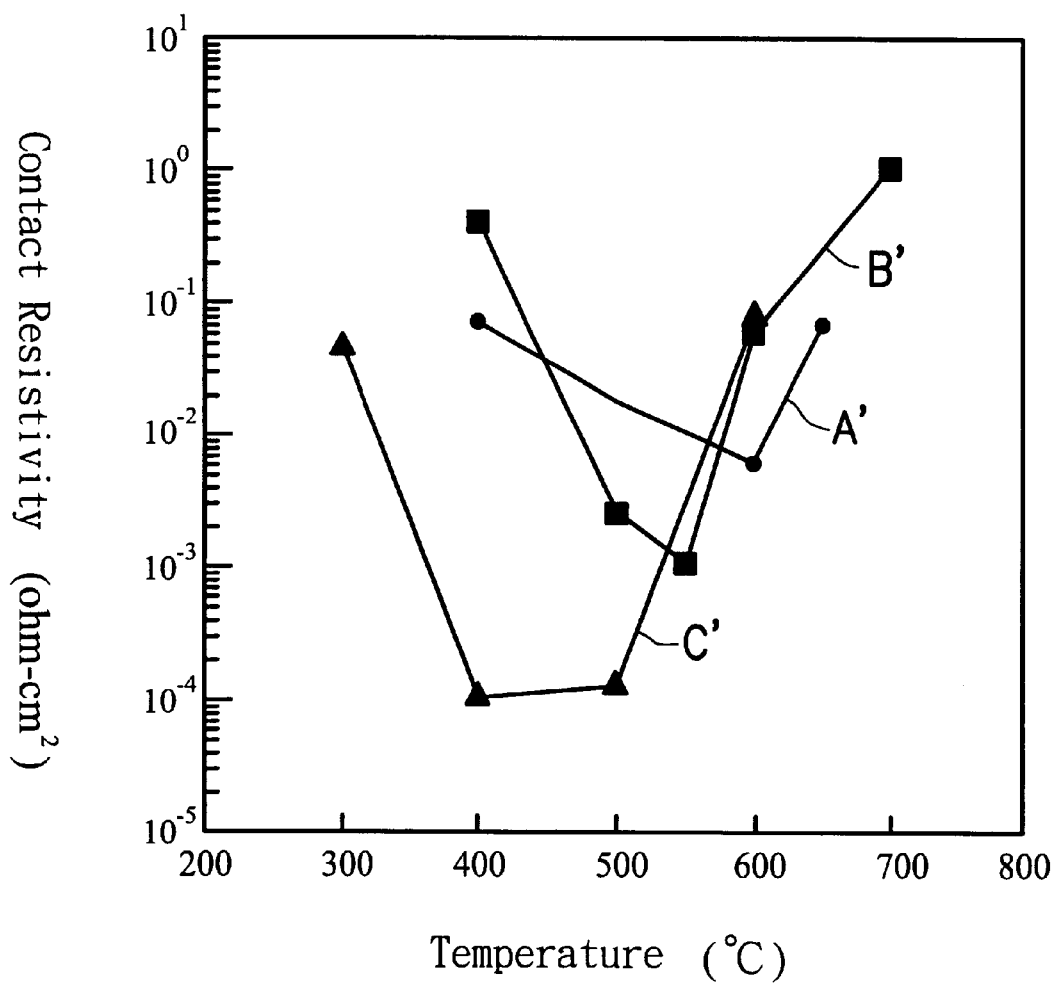
FIG. 4 shows the specific contact resistance obtained by oxidizing Ni/Au layers of different thickness.

FIG. 4 shows the specific contact resistance of the contacts formed by oxidizing Ni/Au layers of various thicknesses on the p-type GaN, wherein curve A' represents that Ni is 50 nm and Au is 125 nm, curve B' represents that Ni is 10 nm and Au is 25 nm, curve C' represents that Ni is 10 nm and Au is 5 nm. The oxidation of the above process is heating the test sheet in air for 10 minutes. According to the current experimental data, the minimum specific contact resistance is $1.0\times10^{-4}$ $\Omega\cdot cm^2$. Using X-ray diffraction to analyze the Ni(10 nm)/Au(5 nm) films heat-treated at 500° C. for 10 minutes, the result shows that Ni converts to NiO and Au is still metallic after heat-treated in air. On the contrary, when the test sheet is heat-treated in nitrogen or 10% $H_2$–90% $N_2$, the Ni/Au film is still metallic, but the $\rho_c$ value is about $10^{-1}$ to $10^{-2}$ $\Omega\cdot cm^2$. Furthermore, if instead of the above Ni(10 nm)/Au(5 nm), a 50 nm thick Ni film is coated on the p-type GaN and then the same oxidation process is performed to form NiO, and the specific contact resistance of the NiO contact to p-type GaN is measured to analyze the effect of NiO, the $\rho_c$ value is only about 0.1 $\Omega\cdot cm^2$, but its I–V curve is a linear curve over a wide range. This means that an ohmic contact is formed between NiO and p-GaN. However, the $\rho_c$ value is high since the NiO thus formed is highly resistant. This indicates that the existence of NiO causes the oxidized Ni/Au film form an ohmic contact. Au primarily gives the thin film with an excellent conductivity, because Au can not form an excellent ohmic contact to p-type GaN. According to the prior art, it has been reported that $\rho_c$ is only 53 $\Omega\cdot cm^2$ (L. L. Smith, et al, J. Mater. Res. 12, 2249(1997)) and $2.6\times10^{-2}$ $\Omega\cdot cm^2$ (T. Mori et al., Appl. Phys. Lett. 69, 3537(1996)) for Au contacts. It has also been reported that stoichiometric NiO is insulating, but becomes p-type if doping with $Li^+$ or creating $Ni^{3+}$ ion vacancies in the NiO. Doping NiO with $Li_2O$ can reduce its resistivity to 0.1 $\Omega\cdot cm$ (Z. M. Jarzebski, Oxide Semiconductors (Pergamon press, Oxford, 1973), Chap. 10). $Ni^{2+}$ ion vacancies formed during the oxidization of Ni create holes (N. Birks and G. H. Meier, Introduction to High Temperature Oxidation of Metals (Edward Arnold, London, 1983), Chap. 4). Therefore, it is inferred that NiO formed in the oxidized Ni/Au is a p-type semiconductor. Au and P-type NiO, which are in a condition of mixed morphology, have a low interface resistance with P-type GaN and can form an ohmic contact to P-type GaN. Hence, Ni/Au film can form an ohmic contact to p-type GaN after oxidation and heat-treatment, and is provided with a low specific contact resistance.

According to the above inference, any thin film including p-type semiconductor oxide and Au can form an excellent ohmic contact with p-type GaN. In addition to NiO, many oxides can be used to form a p-type semiconductor such as MnO, FeO, $Fe_2O_3$, CoO (Z. M. Jarzebski, Oxide Semiconducotrs (Pergamon press, Oxford, 1973), Chap. 11), PdO(R. Uriu et al., J. Phys. Soc. Jpn 60, 2479 (1991)), $CuAlO_2$(H. Kawazoe et al., Nature 389, 939(1997)), $SrCu_2O_2$(A. Kudo et al., Appl. Phys. Lett. 73, 220(1998)), $Rh_2O_3$(A. Roy and J. Ghose, Mater. Res. Bull 33, 547(1998)), CrO, $Cr_2O_3$, $CrO_2$, CuO, $Cu_2O$, SnO, $Ag_2O$, $LaMnO_3$, or $YBa_2Cu_4O_8$, etc.; therefore, it is also possible to form an ohmic contact to p-type GaN using a mixture of this kind of oxide and Au. Furthermore, Au can be replaced by other metals if the metal does not oxidize after heat-treatment. Normally, any noble metal can be used, for example, Au, Pt, Rh, Ru, and Ir, etc.

Figure 2:
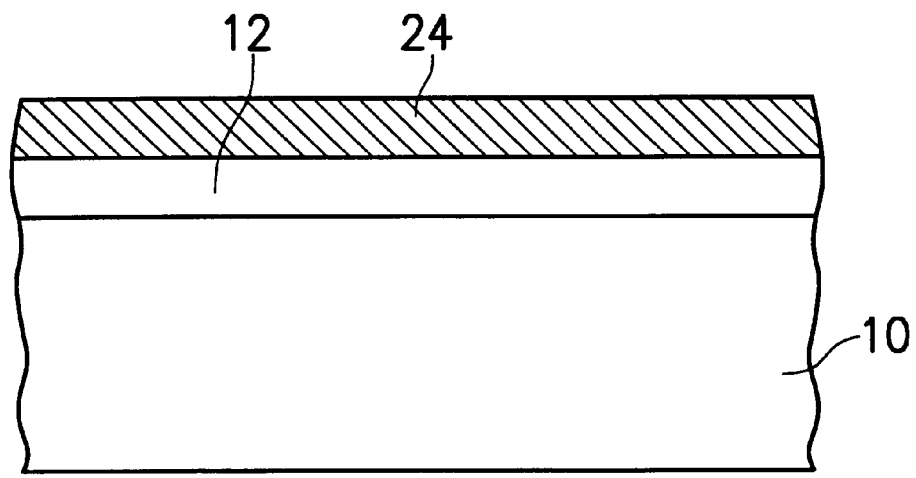
FIG. 2 is a diagram illustrating the structure of an ohmic contact according to another embodiment of the invention.

Referring to FIG. 2, since the interface impedance of the p-type semiconductor oxide and p-type GaN is very low, and the metal can form an ohmic contact having a low resistivity with the p-type semiconductor oxide, another embodiment of this invention comprises sequentially forming a layer of p-type semiconductor oxide 12 and a layer of metal 24 on the p-type GaN 10 to form an ohmic contact to p-type GaN, such as p-GaN/p-NiO/Cr/Au, etc.

In the above embodiments, the ohmic contact to p-type GaN is described. However, the method of fabricating an ohmic contact can be applied in practice to p-type $Al_xGa_yIn_zN$ material, where $0\leq X,4, Z\leq1$, and x+y+z 1.

In the past, the specific contact resistance of a contact formed on p-type GaN could attain only $10^{-2}\sim10^{-3}$ $\Omega\cdot cm^2$, but the ohmic contact of this invention can obtain a much lower interface resistivity of $1.0\times10^{-4}$ $\Omega\cdot cm^2$. This improvement has been applied to the fabrication of LEDs and GaN based laser diodes with good performance.

Furthermore, the metal formed on the semiconductor material in the last embodiment can be replaced by a transparent conductive film, such as indium-tin oxide(ITO), ZnO or ZnO doped with Ga, In, Al or Ce, etc.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method for manufacturing a low resistance ohmic contact to a semiconductor comprising the steps of:

providing a semiconductor substrate;

forming a film including a transition metal and a noble metal on the semiconductor substrate;

heat treating the film in an oxidizing environment to oxidize the transition metal to form a p-type semiconductor oxide, in which the film including the p-type semiconductor oxide and the noble metal serve as an ohmic contact which has a specific contact resistance lower than $1 \times 10^{-4}$ $\Omega cm^2$.

2. The method for manufacturing a low resistance ohmic contact to a semiconductor according to claim 1 comprising the further step of:

the transition metal can transform into a p-type semiconductor oxide during the heat treating step.

3. The method for manufacturing a low resistance ohmic contact to a semiconductor according to claim 1 comprising the further step of:

the noble metal of the multi-layer film is selected from the group consisting of Au, Pt, Rh, Ru, and Ir.

4. The method for manufacturing a low resistance ohmic contact to a semiconductor according to claim 1 comprising the further step of:

wherein the film formed on the semiconductor substrate can be an alloy of transition metal and noble metal.

5. The method for manufacturing a low resistance ohmic contact to a semiconductor according to claim 1 comprising the further step of:

wherein the transition metal is selected from the group consisting of Ni, Mn, Fe, Co, Cr, Cu, and Pd.

6. The method for manufacturing a low resistance ohmic contact to a semiconductor according to claim 1 wherein the step of:

providing a semiconductor substrate includes the step of providing a GaN semiconductor.

7. The method for manufacturing a low resistance ohmic contact to a semiconductor according to claim 6 comprising the further step of:

providing a p-type GaN semiconductor includes providing a p-type $Al_xGa_yIn_zN$ semiconductor wherein $0 \leq x, y, z \leq 1$ and $x+y+z=1$.

* * * * *